United States Patent
Abrahamian et al.

(10) Patent No.: US 9,324,955 B2
(45) Date of Patent: Apr. 26, 2016

(54) TRIAZOLIUM AND TETRAZOLIUM DERIVATIVES AS ORGANIC LIGHT EMITTERS

(71) Applicant: THE TRUSTEES OF DARTMOUTH COLLEGE, Hanover, NH (US)

(72) Inventors: Ivan Abrahamian, Hanover, NH (US); Xin Su, West Lebanon, NH (US)

(73) Assignee: The Trustees of Dartmouth College, Hanover, NH (US)

( * ) Notice: Subject to any disclaimer, the term of this patent is extended or adjusted under 35 U.S.C. 154(b) by 0 days.

(21) Appl. No.: 14/365,947

(22) PCT Filed: Dec. 14, 2012

(86) PCT No.: PCT/US2012/069832
§ 371 (c)(1),
(2) Date: Jun. 16, 2014

(87) PCT Pub. No.: WO2013/090771
PCT Pub. Date: Jun. 20, 2013

(65) Prior Publication Data
US 2014/0336385 A1  Nov. 13, 2014

Related U.S. Application Data

(60) Provisional application No. 61/570,398, filed on Dec. 14, 2011.

(51) Int. Cl.
*H01L 51/00* (2006.01)
*C09K 11/06* (2006.01)
*H05B 33/14* (2006.01)
*H01L 51/50* (2006.01)

(52) U.S. Cl.
CPC ............ *H01L 51/0072* (2013.01); *C09K 11/06* (2013.01); *H05B 33/14* (2013.01); *C09K 2211/1007* (2013.01); *C09K 2211/1059* (2013.01); *H01L 51/5012* (2013.01); *H01L 51/5024* (2013.01)

(58) Field of Classification Search
CPC ........... C09K 11/06; C09K 2211/1018; H01L 51/0072
USPC .................................................. 546/82, 120
See application file for complete search history.

(56) References Cited

FOREIGN PATENT DOCUMENTS

| WO | 2005029923 | 3/2005 |
| WO | 2006049013 | 5/2006 |
| WO | 2009095012 | 8/2009 |

OTHER PUBLICATIONS

PCT/US2012/069832 International Search Report & Written Opinion mailed Apr. 30, 2013, 13 pages.

Su, X. et al., Water soluble triazolopyrdiniums as tunable blue light emitters, Chem. Commun., 2013, 49, 4160-4162 (published online Sep. 26, 2012).
Abboud et al. (2004) "Reactions of seven coordinate complexes. Synthesis, structure, and copper complex of the novel ligand 3-methyltriazolo(1,5-a)6-acetylsemicarbazonepyridine," Inorganica Chemica Acta. 357:321-324.
Amer (1998) "Synthesis and Reactions of 1-Azo-2-azonia-allene Salts Derived from Pyridine Derivatives," Monatshefte fur Chemie. 129:1293-1303.
Ateeq et al. (2001) "Phenylhydrazine" e-EROS Encyclopedia of Reagents for Organic Synthesis.
Battaglia et al. (1994) "A convenient method for the preparation of 3-(2-pyridyl)triazolo[1,5-a]pyridine (L). Crystal structures of L and [CuL2(OH2)2][NO3]2," J. Chem. Soc.: Dalton Trans. pp. 2651-2654.
Beres et al. (1998) "Fused Azolium Salts XVIII [1]. Synthesis and Reactivity of a Novel Fused Heteroaromatic System: [1,2,3]Triazolo[1,5-b]isoquinolinium Salts," Monatshefte fur Chemie. 129:897-908.
Beres et al. (1999) "Valence Bond Isomerization of Fused [1,2,3]Triazolium Salts with Bridgehead Nitrogen Atom. Fused Azolium Salts," J. Org. Chem. 64:5499-5503.
Blessing (1995) "An empirical correction for absorption anisotropy," Acta Cryst. A. 51:33-38.
Bower et al. (1957) "907. Heterocyclic systems related to pyrrocoline. Part II. The preparation of polyazaindenes by dehydrogenative cyclisations," Journal of the Chemical Society. pp. 4506-4510.
Butler et al. (1984) "Stereoisomerization in heterocyclic hydrazones derived from 2-acylpyridines and their oxidative cyclization with mercury(II) acetate and lead tetra-acetate to fused 1,2,4-triazoles and 1,2,3-triazolium systems," Journal of the Chemical Society: Perkins Transactions I. pp. 2109-2116.
Eriksen et al. (1978) "Electron-transfer fluorescence quenching and exciplexes of cyano-substituted anthracenes," J. Phys. Chem. 82:2659-2662.
Gelleri et al. (1980) "The stereochemistry and mechanism of the ring opening reaction of 3-aryltetrazolopyridinium salts and their v-triazolo analogues," Tetrahedron Lett. 21:663-666.
Gray et al. (1976) "Triazines and related products. Part XVI. Synthesis of triazolotriazines by cyclisation of 3-hydrazino-1,2,4-triazines and 3-hydrazino-1,2,4-triazoles," Journal of the Chemical Society: Perkins Transactions I. pp. 1492-1496.
Kotschy et al. (2004) "The 'inverse electron-demand' Diels—Alder reaction in polymer synthesis. Part 5: Preparation and model reactions of some electron-rich bis-dienamines," Tetrahedron 60:3421-3425.
Kuhn et al. (1953) "N-Halogen-acylamide zur Darstellung von Tetrazolium-, Triazolium- und 8-Aza-indazolium-Salzen," Chem. Ber. 86:858-863—with English machine translation of the abstract.
Kuhn et al. (1953) "Über stereoisomere 2-Acyl-pyridin-phenylhydradzone und die Darstellung von 8-Aza-indazolium-Salzen," Chem. Ber. 85:29-37—with English machine translation of the abstract.

(Continued)

*Primary Examiner* — Rita Desai
(74) *Attorney, Agent, or Firm* — Lathrop & Gage LLP

(57) ABSTRACT

Provided herein are organic compounds useful in a variety of OLED applications.

10 Claims, 10 Drawing Sheets

(56) References Cited

OTHER PUBLICATIONS

Lacan et al. (1974) "Electrochemical Synthesis of Heterocyclic Compounds II. Synthesis of Some N-Heterocycles by Intramolecular Oxidative Cyclisation," Syntheric Communications. 4:219-224.

Landge et al. (May 17, 2011) "I. Isomerization Mechanism in Hydrazone-Based Rotary Switches: Lateral Shift, Rotation, or Tautomerization?" J. Am. Chem. Soc. 133:9812-9823.

Martin et al. (Mar. 30, 2012) "Near IR emitting BODIPY fluorophores with mega-stokes shifts," Chem. Commun. 48:5617-5619.

Nielsen et al. (1966) "Studies of Chelates with Heterocyclic Ligands: II. Ionic Nickel(II) and Copper (II) Chelates with 8-Aminoquinoline and some of its Derivatives,"Acta Chem. Scand. 20(4):1113-1121.

Paquette, Leo A.:Ed. Organic Reactions. vol. 48. In Ch. 2; Geise et al. "Radical Cyclization Reactions," John Wiley and Sons, Inc. pp. 301-361 and 835-867.

Perdew et al. (1996) "Generalized Gradient Approximation Made Simple," Phys. Rev. Lett. 77:3865-3868.

Richardson et al. (2002) "Metal Complexes of 2-[1,2,3-thia(and selena)diazol-4-yl]pyridine and an Unusual Silver-induced Selenadiazole Rearrangement," Australian Journal of Chemistry. 55:783-788.

Schafer et al. (1992) "Fully optimized contracted gaussian basis sets for atoms Li to K," J. Chem. Phys. 97:2571-2577.

Sheldrick (2008) "A short history of SHELX," Acta Cryst A. 64:112-122.

Sinnecker et al. (2006) "Calculation of Solvent Shifts on Electronic g-Tensors with the Conductor-Like Screening Model (COSMO) and Its Self-Consistent Generalization to Real Solvents (Direct COSMO-RS)," J. Phys. Chem. A. 110:2235-2245.

Soos et al. (1997) "Novel Thermal Rearrangement of Fused Diaryl-v-Triazolium Salts to Neutral Indazole Derivatives. Fused Azolium Salts," J. Org. Chem. 62:1136-1138.

Wang (1996) Kirk-Othmer Encyclopedia of Chemical Technology. 4th Ed. vol. 18. pp. 837-860.

Yan et al. (Apr. 26, 2011) "N-2-Aryl-1,2,3-triazoles: A Novel Class of UV/Blue-Light-Emitting Fluorophores with Tunable Optical Properties," Chem.-Eur. J. 17:5011-5018.

Zeng et al. (Apr. 15, 2010) "Anti Human Immunodeficiency Virus Type 1 (HIV-1) Agents 4. Discovery of 5,5'-(p-Phenylenebisazo)-8-hydroxyquinoline Sulfonates as New HIV-1 Inhibitors in Vitro," Chem. Pharm. Bull. 58:976-979.

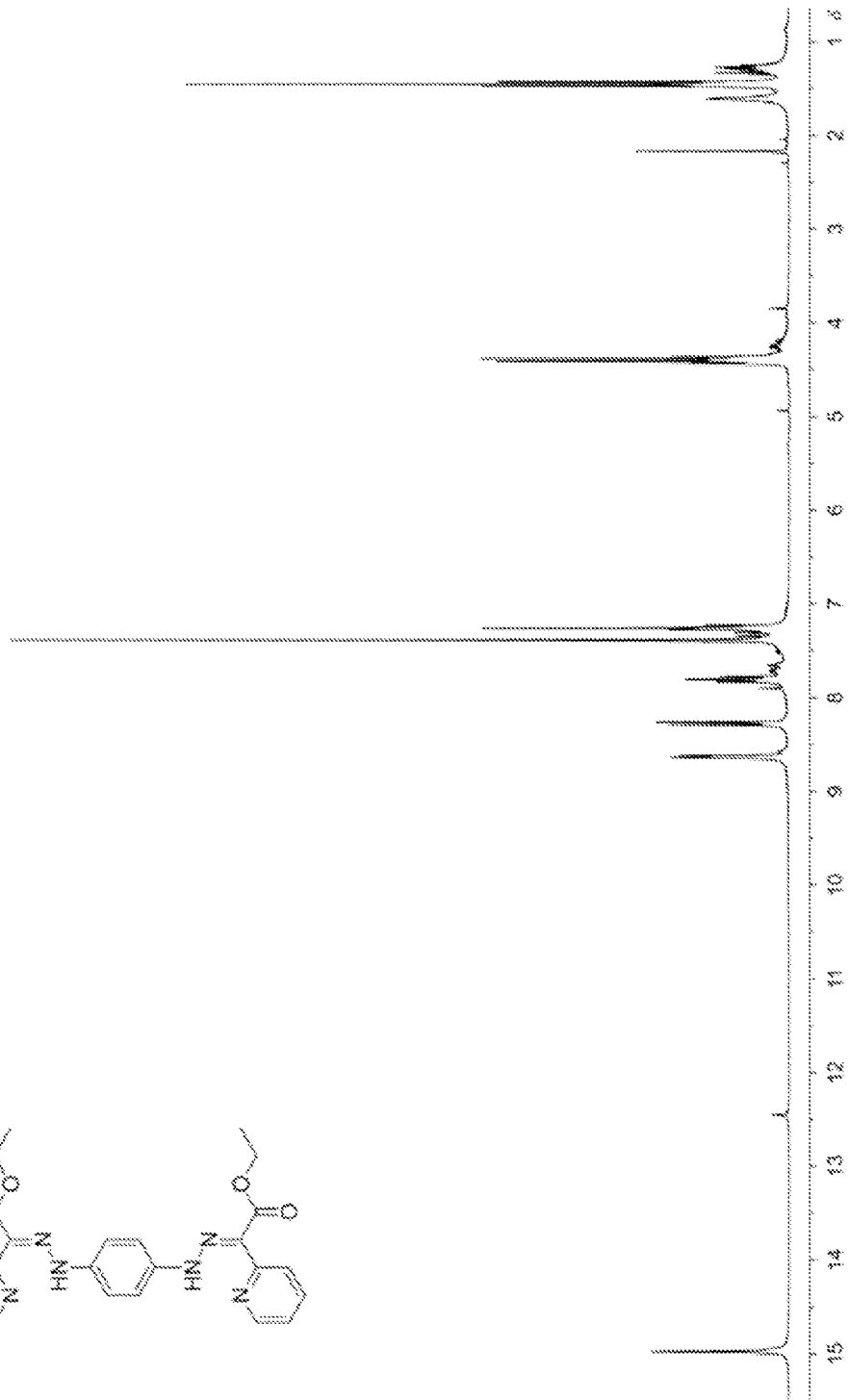
FIGURE 5
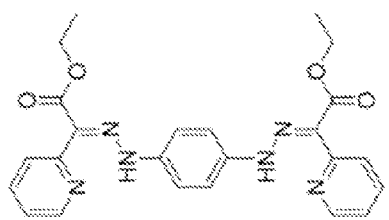

TRIAZOLIUM AND TETRAZOLIUM DERIVATIVES AS ORGANIC LIGHT EMITTERS

PRIORITY BENEFIT

This application is the U.S. national stage application of International Application No. PCT/US2012/069832, filed Dec. 14, 2012, which claims the benefit of U.S. Provisional Application No. 61/570,398 filed on Dec. 14, 2011, the contents of which are hereby incorporated herein in its entirety. The contents of any patents, patent application, and references cited throughout this specification are hereby incorporated by reference in their entireties.

BACKGROUND OF THE INVENTION

Organic light-emitting diodes (OLEDs) exploit the ability of particular materials to emit light when they are excited by means of an electric current. OLEDs have been actively researched because of their capability to emit bright light at a low driving voltage. An OLED generally comprises a light emitting layer (or a plurality of organic layers including a light emitting layer) in between a pair of opposing electrodes. With an electric field applied to the opposing electrodes, electrons and positive holes are injected into the light emitting layer, where they are recombined to form excitons, which emit light. The light emitted from the light emitting layer can be used, for example, to display an image in an electroluminescence device.

OLEDs that emit red, green, and blue light are employed to prepare a full-colored OLED display. Also, efficient white light producing OLED devices are considered to be useful in several applications, such as paper-thin light sources, backlights in LCD displays, automotive dome lights, and room lighting.

SUMMARY OF THE INVENTION

Provided herein are organic compounds that have been found to display electroluminescence in the visible region of the electromagnetic spectrum. Accordingly, these compounds are useful as emitter molecules for OLED applications. For example, these compounds can be used as host molecules in the emitter layer of an OLED. It is also possible to use these compounds in other layers of OLEDs, for example in the electron transport layer. The compounds can emit white, red, green, or blue light when excited. In one embodiment, these molecules emit white light when excited, thus making them useful for white OLED (WOLED) applications. In another embodiment, these compounds emit blue or green light when excited.

These compounds can be synthesized easily, and can therefore be produced on a large scale.

Accordingly, in one aspect, provided herein is an organic light-emitting diode (OLED) comprising at least one compound of the formula I:

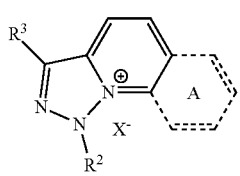

(I)

wherein
A is an optional fused phenyl ring;
$R^1$ is selected from the group consisting of H, $C_{1-6}$alkyl, $C(O)C_{1-6}$alkyl, CN, and $C(O)OC_{1-6}$alkyl;
$R^2$ is selected from the group consisting of CN, $NO_2$, $C_{1-6}$alkyl and aryl, wherein the aryl is optionally independently substituted one or more times with halogen, $C_{1-6}$alkyl or $OC_{1-6}$alkyl; and
$X^-$ is an anion or a dianion.

In another aspect, provided herein is an organic light-emitting diode comprising at least one compound of the formula IIa:

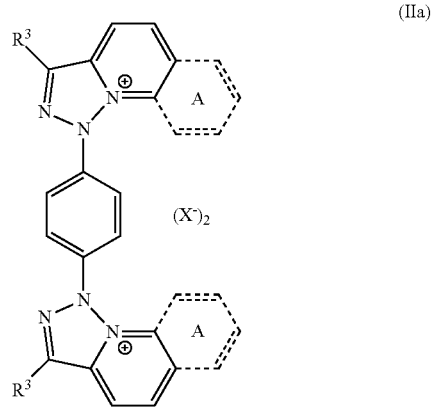

(IIa)

wherein
A is an optional fused phenyl ring;
$R^3$ is selected from the group consisting of H, $C_{1-6}$alkyl, $C(O)C_{1-6}$alkyl, CN, and $C(O)OC_{1-6}$alkyl; and
$X^-$ is an anion or a dianion.

In another aspect, provided herein is an organic light-emitting diode comprising at least one compound of the formula II:

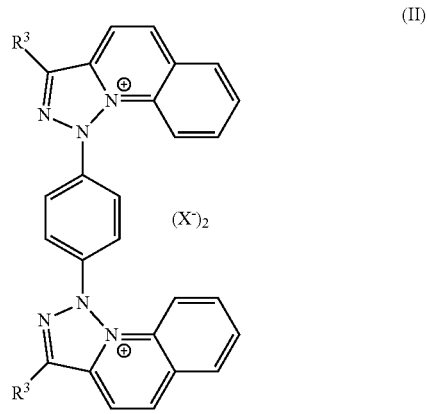

(II)

wherein
$R^3$ is selected from the group consisting of H, $C_{1-6}$alkyl, $C(O)C_{1-6}$alkyl, CN, and $C(O)OC_{1-6}$alkyl; and
$X^-$ is an anion or a dianion.

In still another aspect, provided herein is a compound of the formula I':

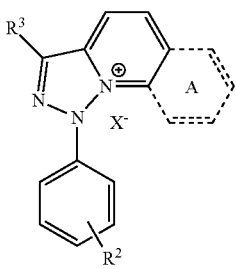

(I')

wherein

A is an optional fused phenyl ring;

R$^1$ is selected from the group consisting of H, C(O)C$_{1-6}$alkyl, CN, and C(O)OC$_{1-6}$alkyl;

R$^2$ is selected from the group consisting of H, halogen, C$_{1-6}$alkyl and OC$_{1-6}$alkyl; and X$^-$ is an anion or a dianion.

In another aspect, provided herein is a compound of the formula IIa':

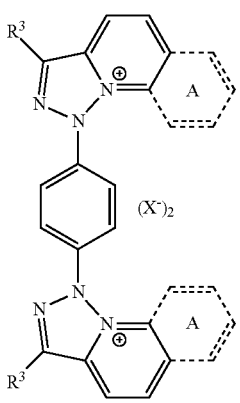

(IIa')

wherein

A is an optional fused phenyl ring;

R$^3$ is selected from the group consisting of H, C$_{1-6}$alkyl, C(O)C$_{1-6}$alkyl, CN, and C(O)OC$_{1-6}$alkyl; and X$^-$ is an anion or a dianion.

In another aspect, provided herein is a compound of the formula II':

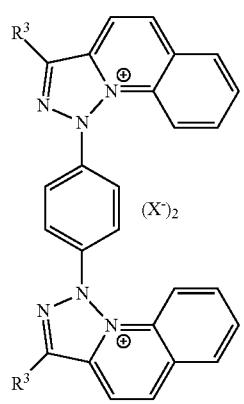

(II')

wherein

R$^3$ is selected from the group consisting of H, C$_{1-6}$alkyl, C(O)C$_{1-6}$alkyl, CN, and C(O)OC$_{1-6}$alkyl; and X$^-$ is an anion or a dianion.

DETAILED DESCRIPTION OF THE FIGURES

FIG. 5 shows the $^1$H NMR spectrum of precursor 1b in CDCl$_3$ at 294 K in the presence of the minor Z isomer.

DETAILED DESCRIPTION OF THE INVENTION

Triazolium and Tetrazolium Compounds

Figure 1:
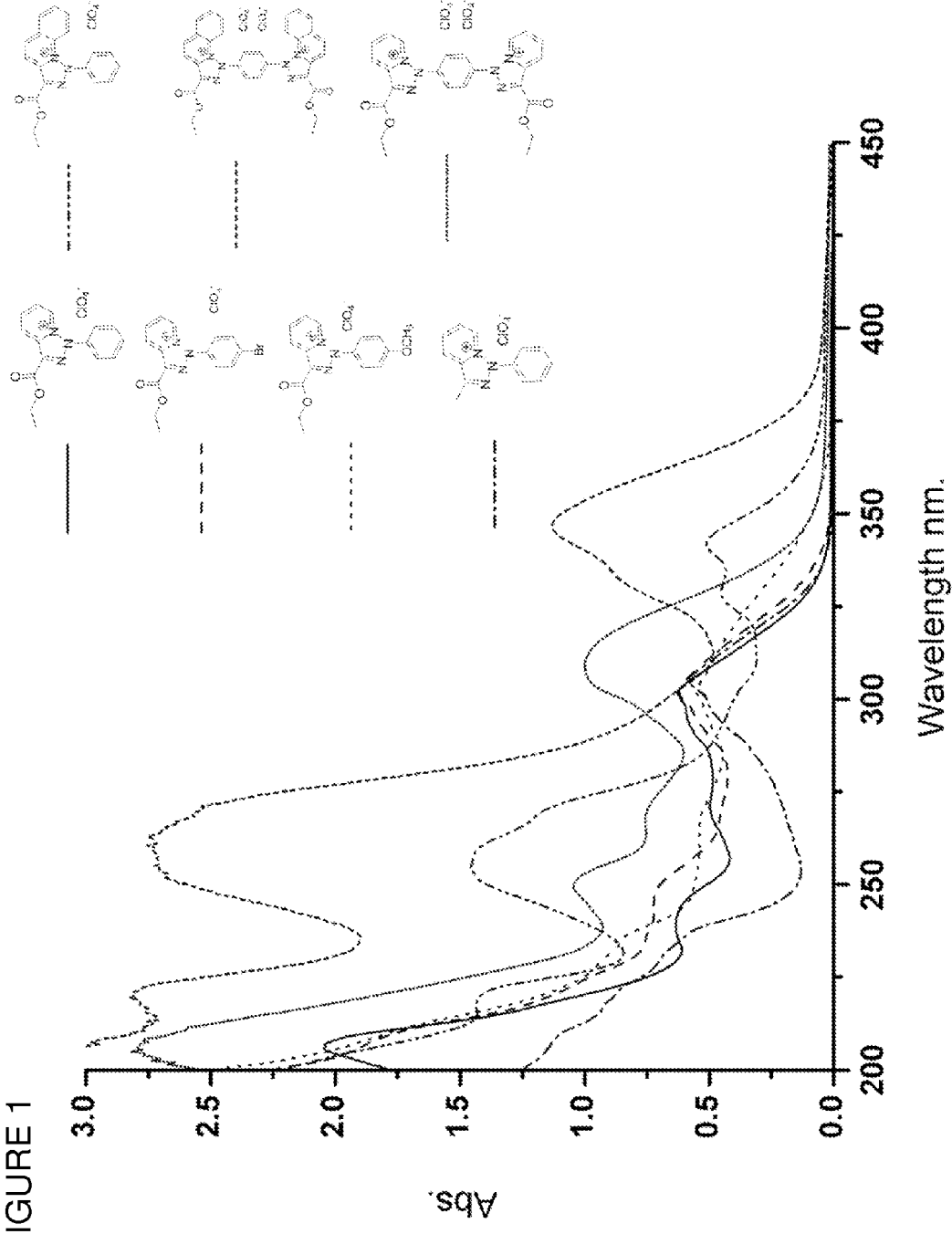
FIG. 1 shows the UV/Vis spectra of some triazolium derivatives described herein (5×10$^{-5}$M, CH$_3$CN).
Figure 2:
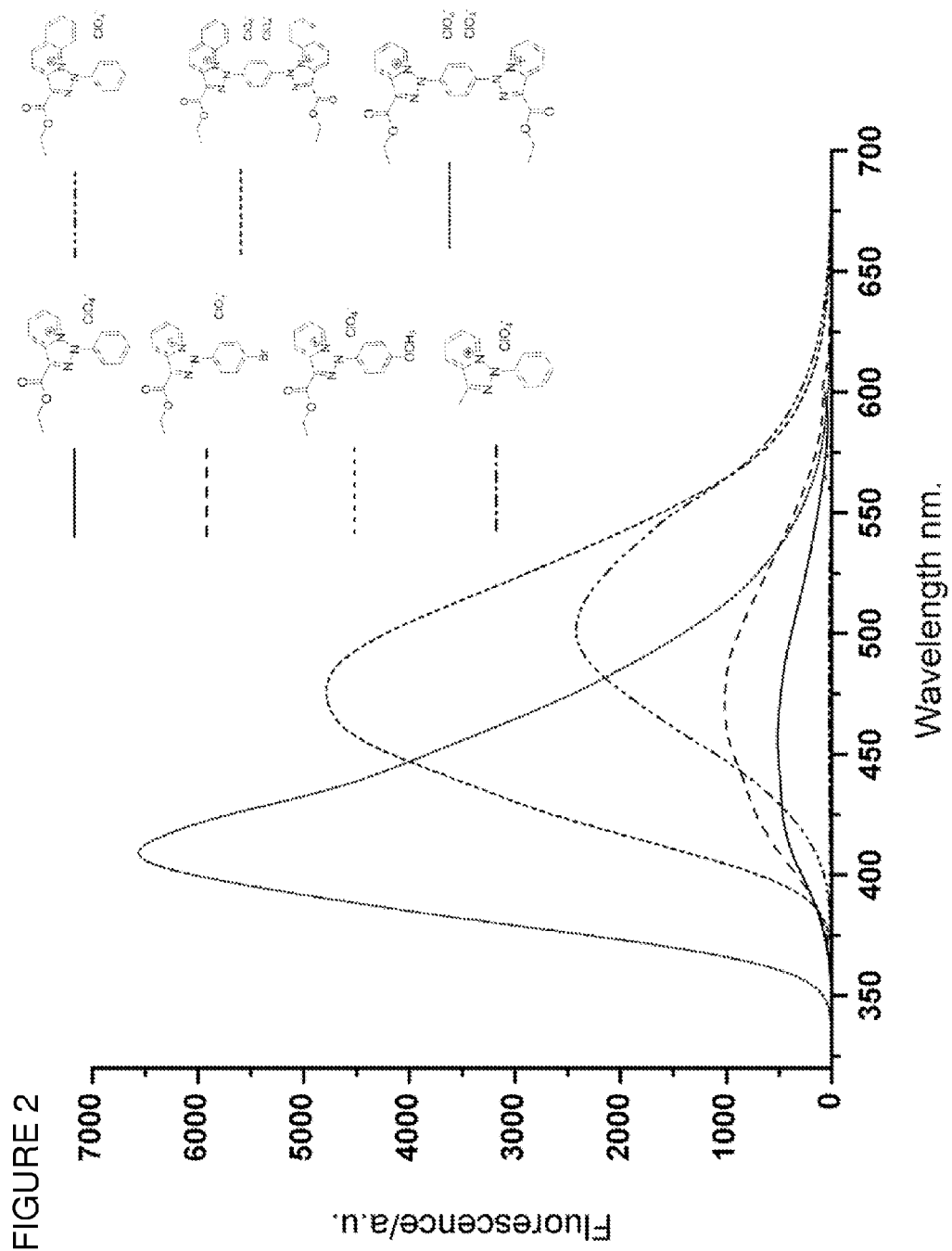
FIG. 2 shows fluorescence emission spectra of some triazolium derivatives described herein (5×10$^{-5}$M, CH$_3$CN).
Figure 3:
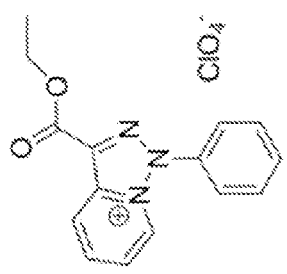
FIG. 3 shows the $^1$H NMR spectrum of 2a, a salt of formula I', in CD$_3$CN at 294 K.
Figure 3:
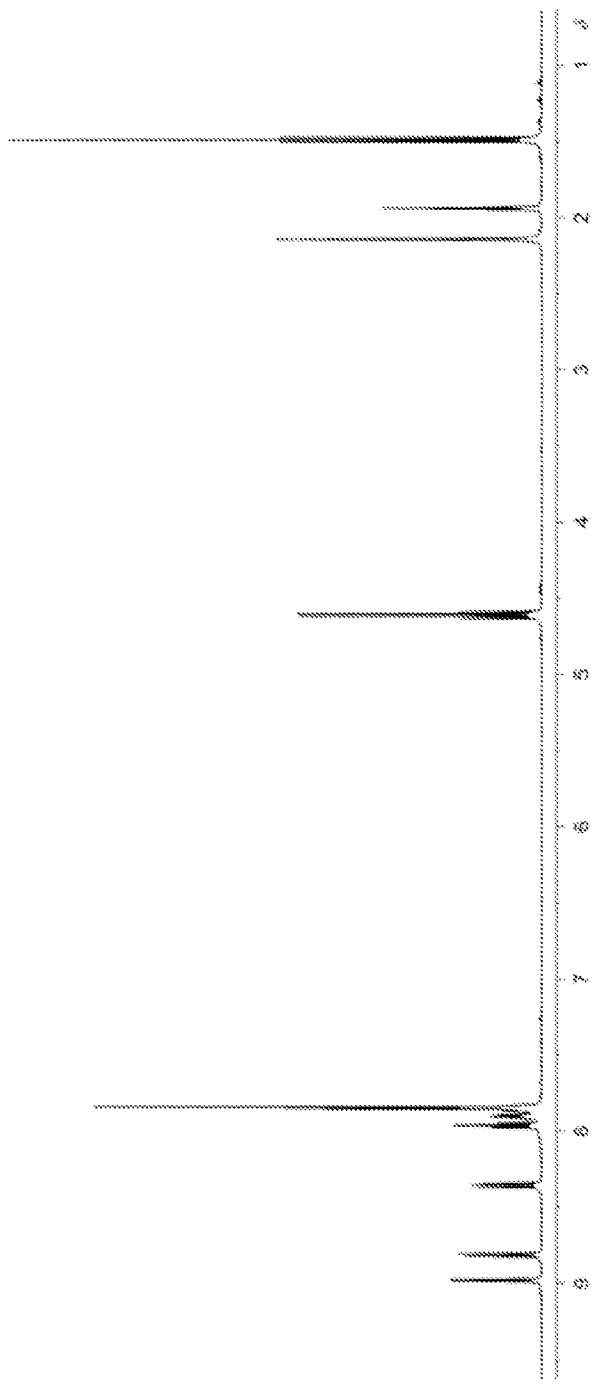
Figure 4:
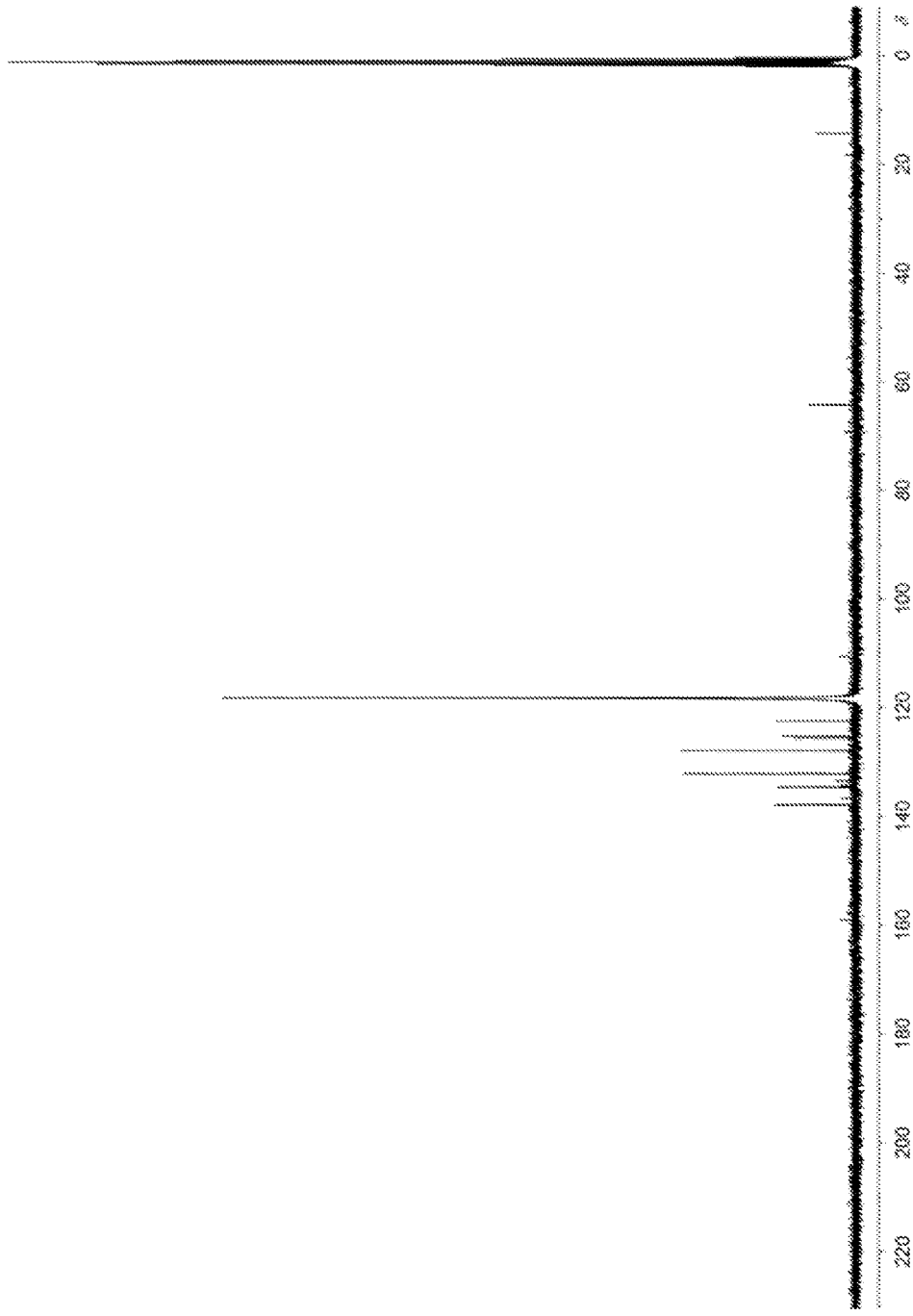
FIG. 4 shows the $^{13}$C NMR spectrum of 2a, a salt of formula I', in CD$_3$CN at 294 K.
Figure 6:
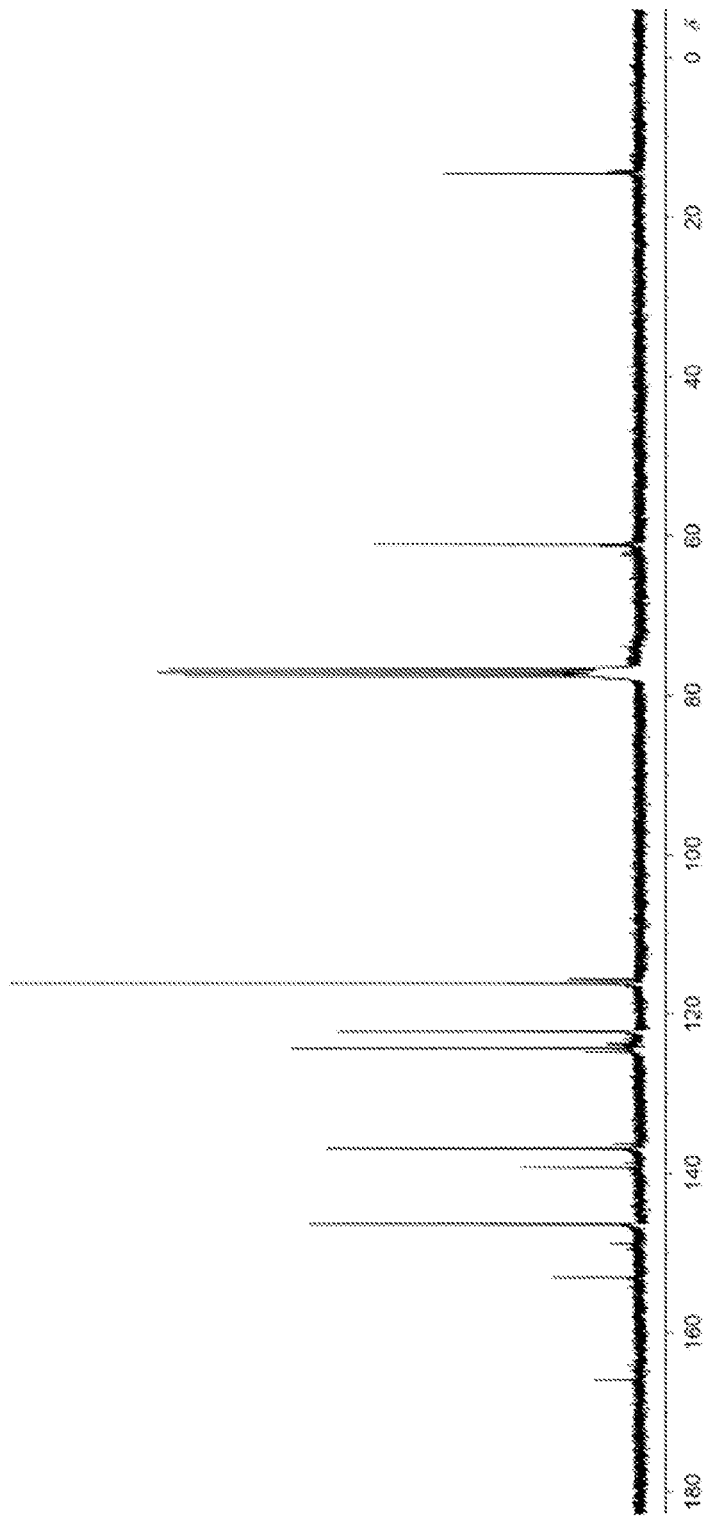
FIG. 6 shows the $^{13}$C NMR spectrum of precursor 1b in CDCl$_3$ at 294 K in the presence of the minor Z isomer.
Figure 7:
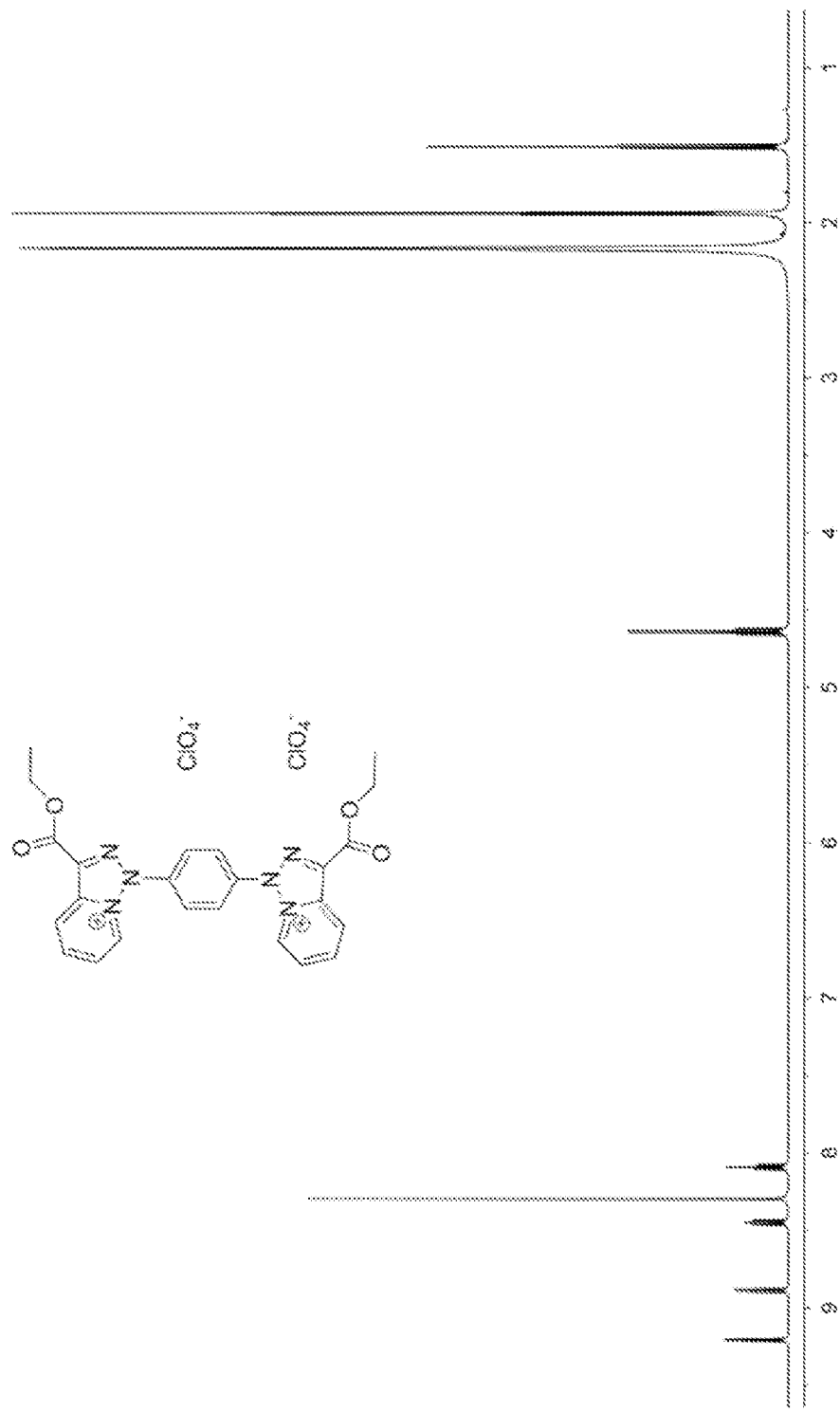
FIG. 7 shows the $^1$H NMR spectrum of 2b, a salt of formula IIa', in CD$_3$CN at 294 K.
Figure 8:
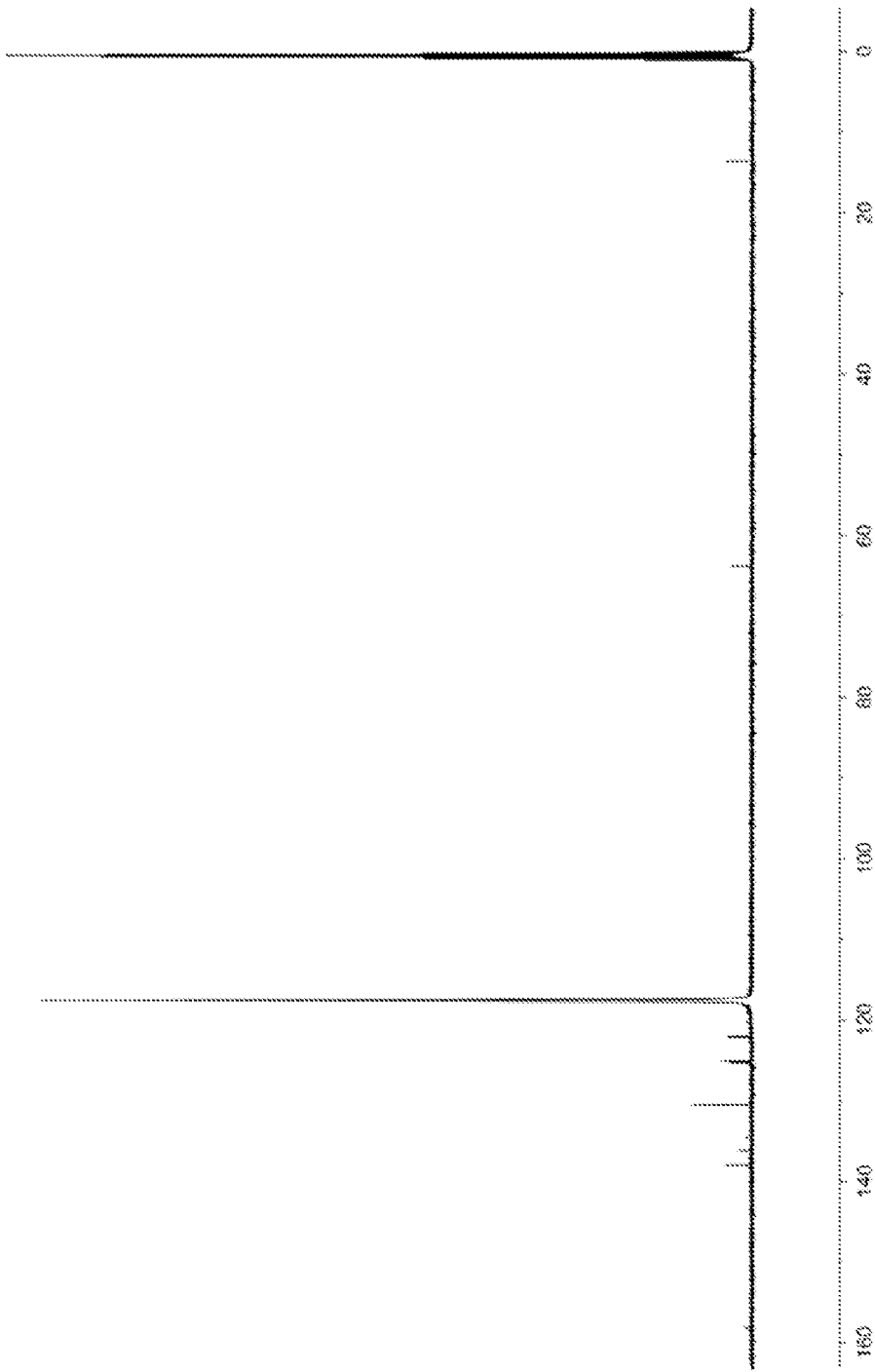
FIG. 8 shows the $^{13}$C NMR spectrum of 2b, a salt of formula IIa', in CD$_3$CN at 294 K.

The organic compounds described herein are suitable for use in OLEDs. In particular, they can be used in the electron transport layer or in the light-emitting layer of an OLED. The compounds can be employed as emitter substances in OLEDs, as they display luminescence (electroluminescence) in the visible region of the electromagnetic spectrum. These compounds make it possible to display electroluminescence in the white, red, green and blue regions of the electromagnetic spectrum. It is also possible to display electroluminescence both in the blue region and in the white region of the electromagnetic spectrum.

Accordingly, in one aspect, provided herein is an organic light-emitting diode (OLED) comprising at least one compound of the formula I:

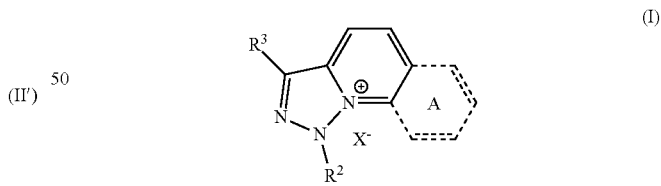

(I)

wherein

A is an optional fused phenyl ring;

R$^1$ is selected from the group consisting of H, C$_{1-6}$alkyl, C(O)C$_{1-6}$alkyl, CN, and C(O)OC$_{1-6}$alkyl;

R$^2$ is selected from the group consisting of CN, NO$_2$, C$_{1-6}$alkyl and aryl, wherein the aryl is optionally independently substituted one or more times with halogen, C$_{1-6}$alkyl or OC$_{1-6}$alkyl; and X$^-$ is an anion or a dianion.

The anion can be a halide ion, a sulfate ion, a perchlorate ion, a hexafluorophosphate ion, or a borate ion (e.g., a tetrafluoroborate ion).

In one embodiment, $R^1$ is selected from the group consisting of $C(O)C_{1-6}$alkyl, CN, and $C(O)OC_{1-6}$alkyl. In another embodiment, $R^1$ is selected from the group consisting of $C(O)C_{1-3}$alkyl, CN, and $C(O)OC_{1-3}$alkyl.

In an embodiment, $R^2$ of formula I can be phenyl that is optionally independently substituted one or more times with halogen, $C_{1-6}$alkyl or $OC_{1-6}$alkyl.

In one embodiment of formula I, A is not present.

For the OLED described above, the compound of formula I can be in one or more of the following forms:

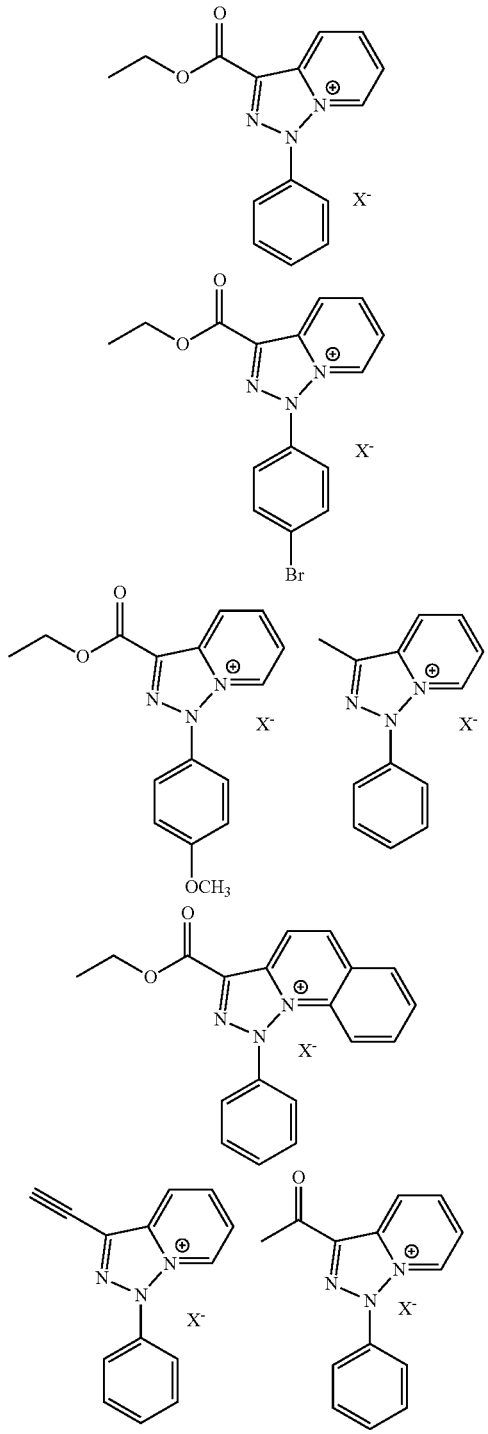

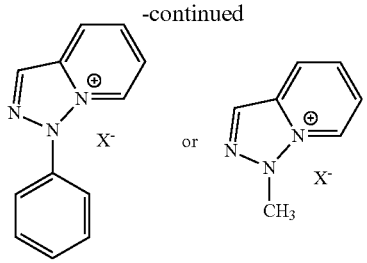

In one embodiment of these forms, $X^-$ is perchlorate.

In another aspect, provided herein is an organic light-emitting diode comprising at least one compound of the formula IIa:

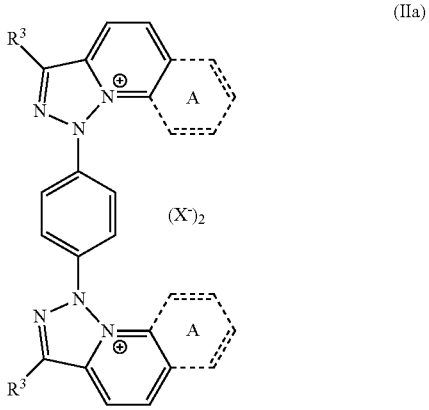

(IIa)

wherein
A is an optional fused phenyl ring;
$R^3$ is selected from the group consisting of H, $C_{1-6}$alkyl, $C(O)C_{1-6}$alkyl, CN, and $C(O)OC_{1-6}$alkyl; and
$X^-$ is an anion or a dianion.

The anion can be a halide ion, a sulfate ion, a perchlorate ion, a hexafluorophosphate ion, or a borate ion (e.g., a tetrafluoroborate ion).

In an embodiment of Formula IIa,
A is not present;
$R^3$ is selected from the group consisting of H, $C_{1-6}$alkyl, $C(O)C_{1-6}$alkyl, CN, and $C(O)OC_1$alkyl or $C(O)OC_{3-6}$alkyl; and
$X^-$ is an anion or a dianion.

In another aspect, provided herein is an organic light-emitting diode comprising at least one compound of the formula II:

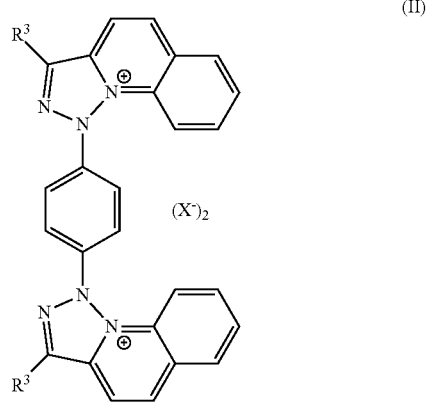

(II)

wherein

R³ is selected from the group consisting of H, C$_{1-6}$alkyl, C(O)C$_{1-6}$alkyl, CN, and C(O)OC$_{1-6}$alkyl; and X⁻ is an anion or a dianion.

The anion can be a halide ion, a sulfate ion, a perchlorate ion, a hexafluorophosphate ion, or a borate ion (e.g., a tetrafluoroborate ion).

Compound IIa can be represented by one of the following compounds:

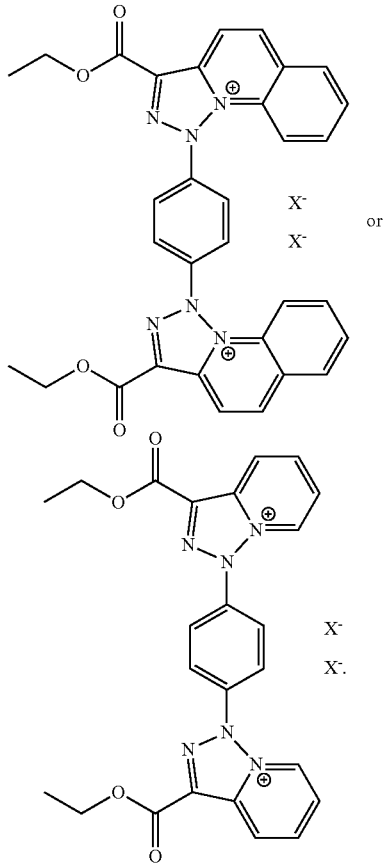

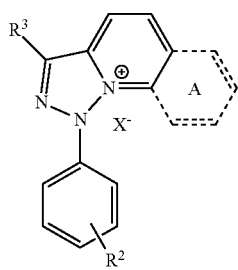

In an embodiment of these compounds, X⁻ is perchlorate.

In one embodiment of any of the OLEDs comprising a compound of formula I, formula IIa, or formula II, the compounds are used as emitter molecules. In another embodiment, the compounds are used as host molecules in an emitter layer. In another embodiment, the compound of formula I, IIa, or II emits white, green, or blue light. In a particular embodiment, the compound of formula I, IIa, or II emits white or blue light. Accordingly, the compounds can be used in OLEDs that produce white, green, or blue light.

In another aspect, provided herein is a compound of the formula I':

(I')

wherein

A is an optional fused phenyl ring;

R¹ is selected from the group consisting of H, C(O)C$_{1-6}$alkyl, CN, and C(O)OC$_{1-6}$alkyl;

R² is selected from the group consisting of H, halogen, C$_{1-6}$alkyl and OC$_{1-6}$alkyl; and X⁻ is an anion or a dianion.

In an embodiment, the halide ion is a sulfate ion, a perchlorate ion, a hexafluorophosphate ion, or a borate ion (e.g., a tetrafluoroborate ion).

In one embodiment of formula I', R¹ is selected from the group consisting of C(O)C$_{1-6}$alkyl, CN, and C(O)OC$_{1-6}$alkyl. In still another embodiment, R¹ is selected from the group consisting of C(O)C$_{1-3}$alkyl, CN, and C(O)OC$_{1-3}$alkyl.

In another embodiment of formula I', R² is selected from the group consisting of halogen, C$_{1-6}$alkyl, and OC$_{1-3}$alkyl. In another embodiment, R² is in the para position.

In another embodiment of I', A is not present.

Specific, non-limiting examples of compounds of formula I' are shown below:

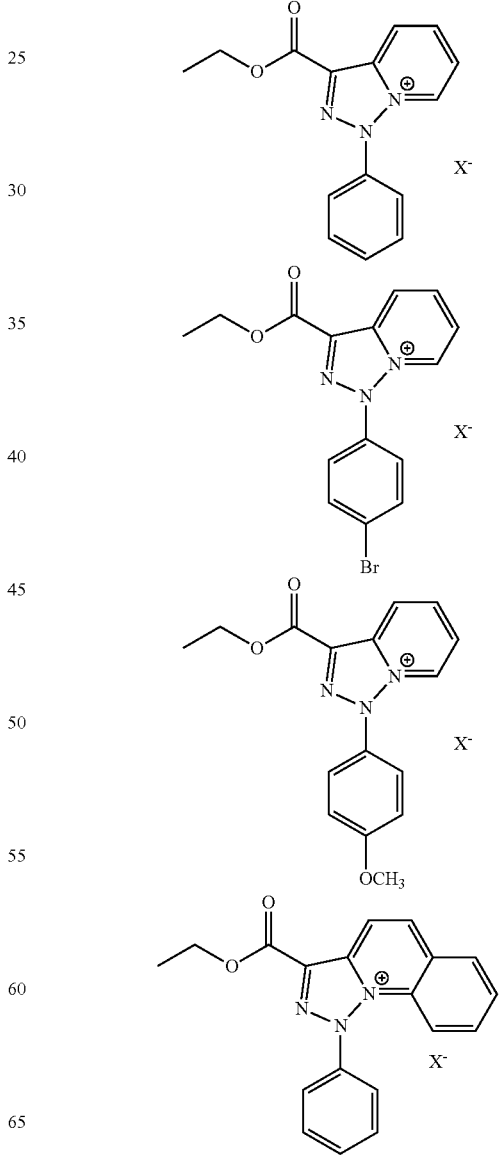

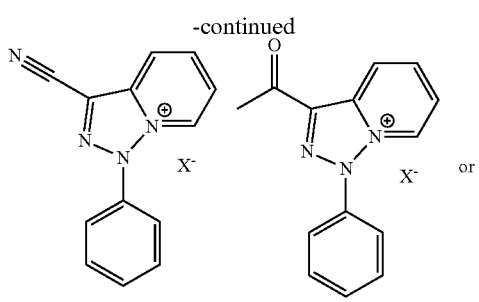

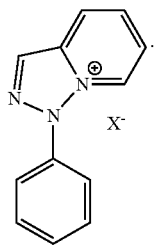

In a particular embodiment of these compounds, X⁻ is perchlorate.

In another aspect, provided here is a compound of claim IIa':

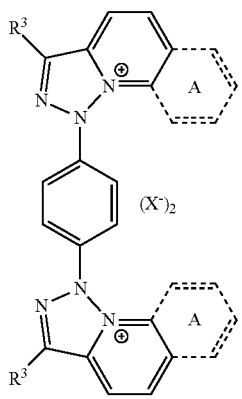

(IIa')

wherein

A is an optional fused phenyl ring;

R³ is selected from the group consisting of H, C$_{1-6}$alkyl, C(O)C$_{1-6}$alkyl, CN, and C(O)OC$_{1-6}$alkyl; and X⁻ is an anion or a dianion.

The anion can be a halide ion, a sulfate ion, a perchlorate ion, a hexafluorophosphate ion, or a borate ion (e.g., a tetrafluoroborate ion).

In an embodiment of Formula IIa',

A is not present;

R³ is selected from the group consisting of H, C$_{1-6}$alkyl, C(O)C$_{1-6}$alkyl, CN, and C(O)OC$_1$alkyl or C(O)OC$_{3-6}$alkyl; and X⁻ is an anion or a dianion.

In another aspect, provided here is a compound of claim II':

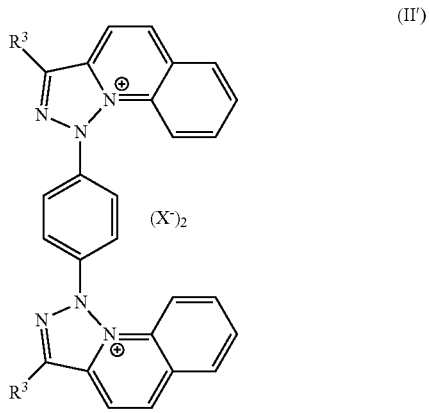

(II')

wherein

R³ is selected from the group consisting of H, C$_{1-6}$alkyl, C(O)C$_{1-6}$alkyl, CN, and C(O)OC$_{1-6}$alkyl; and X⁻ is an anion or a dianion.

The anion can be a halide ion, a sulfate ion, a perchlorate ion, a hexafluorophosphate ion, or a borate ion (e.g., a tetrafluoroborate ion).

In one embodiment, the compound of formula IIa' is one of the following compounds:

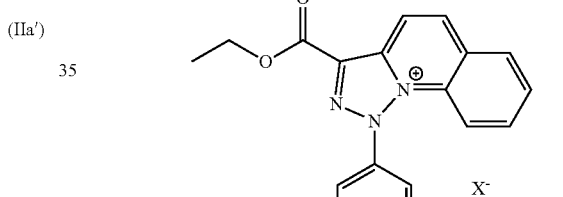

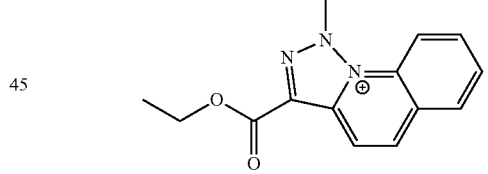

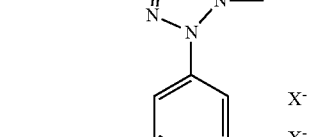

In one embodiment of these compounds, X⁻ is perchlorate.

In another aspect, provided herein is a compound of formula III:

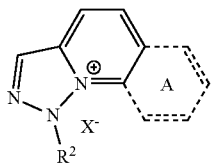

(III)

wherein $R^2$, $X^-$ and ring A have the meanings given for Formula I. Also provided herein is an OLED device comprising a compound of formula III.

The anion of Formula III can be a halide ion, a sulfate ion, a perchlorate ion, a hexafluorophosphate ion, or a borate ion (e.g., a tetrafluoroborate ion).

In one embodiment of Formula III, $R^1$ is selected from the group consisting of $C(O)C_{1-6}$alkyl, CN, and $C(O)OC_{1-6}$alkyl. In another embodiment, $R^1$ is selected from the group consisting of $C(O)C_{1-3}$alkyl, CN, and $C(O)OC_{1-3}$alkyl.

In an embodiment, $R^2$ of formula III can be phenyl that is optionally independently substituted one or more times with halogen, $C_{1-6}$alkyl or $OC_{1-6}$alkyl.

In one embodiment of formula III, A is not present.

In another aspect, provided herein is a compound of formula IV:

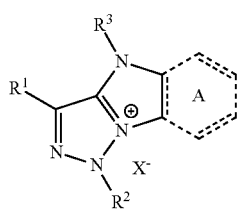

(IV)

wherein $R^1$, $R^2$, $X^-$ and ring A have the meanings given for formula I, and $R^3$ is H or $C_{1-6}$alkyl. Also provided herein is an OLED device comprising a compound of formula IV.

The anion of formula IV can be a halide ion, a sulfate ion, a perchlorate ion, a hexafluorophosphate ion, or a borate ion (e.g., a tetrafluoroborate ion).

In one embodiment, $R^1$ is selected from the group consisting of $C(O)C_{1-6}$alkyl, CN, and $C(O)OC_{1-6}$alkyl. In another embodiment, $R^1$ is selected from the group consisting of $C(O)C_{1-3}$alkyl, CN, and $C(O)OC_{1-3}$alkyl.

In an embodiment, $R^2$ of formula IV can be phenyl that is optionally independently substituted one or more times with halogen, $C_{1-6}$alkyl or $OC_{1-6}$alkyl.

In another embodiment, $R^3$ is H or methyl.

In one embodiment of formula IV, A is not present.

As used herein, the term "anion" refers to any anion that is appropriate for use in an OLED. Non-limiting examples of such ions include, but are not limited to, $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids. In a particular embodiment, the anion is a halide ion, a sulfate ion, a perchlorate ion, a hexafluorophosphate ion, or a borate ion (e.g., a tetrafluoroborate ion).

As used herein, the term "dianion" refers to any dianion that is appropriate for use in an OLED. When a dianion is used with compounds of formulae I, I', III or IV, there will be a 2 to 1 ratio of organic molecule to dianion.

As used herein, the term "alkyl" refers to a fully saturated branched or unbranched hydrocarbon moiety. Preferably the alkyl comprises 1 to 20 carbon atoms, more preferably 1 to 16 carbon atoms, 1 to 10 carbon atoms, 1 to 7 carbon atoms, 1 to 6 carbons, 1 to 4 carbons, or 1 to 3 carbon atoms. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, n-decyl and the like. Furthermore, the expression "$C_x$-$C_y$-alkyl", wherein x is 1-5 and y is 2-10 indicates a particular alkyl group (straight- or branched-chain) of a particular range of carbons. For example, the expression $C_1$-$C_4$-alkyl includes, but is not limited to, methyl, ethyl, propyl, butyl, isopropyl, tert-butyl and isobutyl.

The term "aryl" includes aromatic monocyclic or multicyclic e.g., tricyclic, bicyclic, hydrocarbon ring systems consisting only of hydrogen and carbon and containing from six to nineteen carbon atoms, or six to ten carbon atoms, where the ring systems may be partially saturated. Aryl groups include, but are not limited to, groups such as phenyl, tolyl, xylyl, anthryl, naphthyl and phenanthryl. Aryl groups can also be fused or bridged with alicyclic or heterocyclic rings which are not aromatic so as to form a polycycle (e.g., tetralin).

OLED Devices Comprising Triazolium and Tetrazolium Derivatives

Also provided herein are OLED devices comprising the compounds provided herein (i.e., compounds of formula I, formula IIa, formula II, formula IIa', formula II', formula III, and formula IV, as well as specific compounds disclosed herein). Essentially, OLEDs are made up of an anode, a hole transport layer, a light-emitting layer, an electron-transport layer, and a cathode. The compounds provided herein can be used as emitter molecules in the light-emitting layer. Also provided herein is a light-emitting layer comprising at least one of the compounds described herein. The further layers in the OLED can be made up of any material which is customarily used in such layers and is known to those skilled in the art. A person skilled in the art will be able to select the structure of the OLEDs in such a way that it is optimally matched to the organic compounds described herein as emitter substances.

The compounds provided herein can be present without further additives in the light-emitting layer. However, it is also possible for further compounds and/or compositions to be present in the light-emitting layer. For example, a fluorescent dye can be present in order to alter the emission color of the organic compound used as emitter molecule. Furthermore, a diluent material can be used. This diluent material can be a polymer, for example poly(N-vinylcarbazole) or polysilane. However, the diluent material can likewise be a small molecule, for example 4,4'-N,N'-dicarbazolebiphenyl (CBP) or tertiary aromatic amines.

The abovementioned individual layers of the OLED can in turn be made up of 2 or more layers. For example, the hole transport layer can be made up of a layer into which holes are injected from the electrode and a layer which transports the holes away from the hole injection layer to the light-emitting layer. The electron transport layer can likewise consist of a plurality of layers, for example a layer into which electrons are injected by the electrode and a layer which receives electrons from the electron injection layer and transports them to the light-emitting layer. These layers can be selected according to factors such as energy level, heat resistance and charge carrier mobility and also energy difference between the layers mentioned and the organic layers or the metal electrodes.

Provided below are brief descriptions of the anode, hole transport layer, light-emitting layer, and cathode components of and OLED. These descriptions are meant to be non-limiting.

The anode is an electrode which provides positive charge carriers. It can, for example, be made up of materials comprising a metal, a mixture of various metals, a metal alloy, a metal oxide or a mixture of various metal oxides. As an alternative, the anode can be a conductive polymer. Suitable metals include the metals of groups Ib, IVa, Va, and VIa and the transition metals of group VIII of the periodic table of the elements. The anode can be made to be transparent to light by using mixed metal oxides of groups IIb, IIIb, and IVb, for example indium-tin oxide (ITO). It is also possible for the anode to comprise an organic material, for example polyaniline. At least one of the anode or cathode should be at least partially transparent to enable the light produced to be emitted.

Suitable materials for the hole transport layer of the OLEDs described herein are disclosed, for example, in Kirk-Othmer Encyclopedia of Chemical Technology, 4th edition, Vol. 18, pages 837 to 860, 1996, which is incorporated herein by reference. Both hole-transporting molecules and polymers can be used as the hole transport material. Non-limiting examples of hole-transporting polymers are selected from the group consisting of polyvinylcarbazoles, (phenylmethyl)polysilanes and polyanilines. It is likewise possible to obtain hole-transporting polymers by doping polymers such as polystyrene and polycarbonate with hole-transporting molecules.

Suitable electron-transporting materials for OLEDs described herein can include, for example, metals chelated with oxinoid compounds, e.g., tris(8-quinolinolato)aluminum ($Alq_3$), compounds based on phenanthroline, e.g., 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). The electron-transporting layer can serve either to aid electron transport or as a buffer layer or barrier layer to avoid quenching of the exciton at the boundaries of the layers of the OLED. The layer preferably improves the mobility of the electrons and reduces quenching of the exciton.

The cathode is an electrode that serves to introduce electrons or negative charge carriers. The cathode can be any metal or nonmetal that has a lower work function than the anode. Suitable materials for the cathode are selected from the group consisting of alkali metals of group Ia, for example Li, Cs, alkaline earth metals of group IIa, metals of group IIb of the periodic table of the Elements including the rare earth metals and the lanthanides and actinides. Metals such as aluminum, indium, calcium, barium, samarium and magnesium and combinations thereof can also be used. Furthermore, lithium-containing organometallic compounds or LiF can also be applied between the organic layer and the cathode to reduce the operating voltage.

The OLEDs comprising the compounds provided herein can further comprise additional layers that are known to those skilled in the art. For example, a further layer can be applied between the hole transport layer and the light-emitting layer in order to aid transport of the positive charge and/or to match the band gap of the layers to one another. As an alternative, this further layer can serve as protective layer. In an analogous way, additional layers can be present between the light-emitting layer and the electron-transport layer to aid transport of the negative charge and/or to match the band gap between the layers to one another. As an alternative, this layer can serve as protective layer.

The OLED comprising the compounds described herein can be produced by well-known methods. The OLED is generally prepared by successive vapor deposition of the individual layers on a suitable substrate. Suitable substrates are, for example, glass or polymer films. The vapor deposition can be carried out using customary techniques such as thermal vaporization, chemical vapor deposition and others. In an alternative process, the organic layers can be applied from solutions or dispersions in suitable solvents, with coating techniques known to those skilled in the art being employed.

The OLEDs comprising the compounds described herein can be used in all devices in which electroluminescence is useful. Examples of such devices include stationary and mobile video display units (VDUs). Stationary VDUs are, for example, VDUs of computers, televisions, VDUs in printers, kitchen appliances and advertising signs, lighting and information signs. Mobile VDUs are, for example, VDUs in mobile telephones, laptops, vehicles and destination displays on buses and trains.

The compounds provided herein also have utility in light emitting electrochemical cells. Accordingly, in one embodiment, provided herein is a light emitting electrochemical cell comprising a compound provided herein.

The compounds provided herein also have utility as an organic semiconductor in optical electronic devices, more typically used as organic field effect transistors (OFET) in integrated electronic devices, such as liquid crystal display (LCD), electronic paper, organic light emitting diode (OLED) display panel, organic radio frequency identification (ORFID) tags, organic photovoltaic (OPV), sensor devices, and analog and digital electronics.

As discussed above, the disclosed compounds also emit white light when excited, which makes them useful for white OLEDs. White OLED emission can be used to prepare a full-color device using red, green, and blue (RGB) color filters. The RGB filters may be deposited on the substrate (when light transmission is through the substrate), incorporated into the substrate, or deposited over the top electrode (when light transmission is through the top electrode). When depositing a RGB filter array over the top electrode, a buffer layer of appropriate thickness, for example from 1 to 1000 nm, may be used to protect the top electrode. The buffer layer may comprise inorganic materials, for example, silicon oxides and nitrides, or organic materials, for example, polymers, or multiple layers of inorganic and organic materials. Methods for providing RGB filter arrays are well known in the art. Lithographic means, inkjet printing, and laser thermal transfer are just a few of the methods RGB filters may be provided.

EXPERIMENTAL

General Synthesis of 1,2,3-Triazolium and Tetrazolium Derivatives of Formulae I, I', IIa, II, IIa', and II' Formed via Cu(II) Oxidative Cyclization of Hydrazones Scheme 1. Syntheses of derivatives via Cu(II) oxidative cyclization of hydrazones.

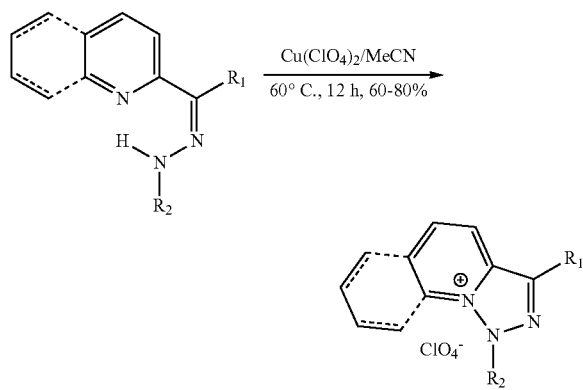

General Procedures:

1 mmol of the appropriate hydrazone starting material was dissolved in 5 mL acetonitrile, and the well stirred solution was heated to 60° C. Copper(II) perchlorate hexahydrate (Cu(ClO$_4$)$_2$·6H$_2$O) (4 mmol; 4 equiv) was then added to the solution. The reaction mixture was kept at 60° C. overnight. The reaction mixture was then filtered, and 30 mL 5% (wt.) perchloric acid (HClO$_4$) solution was added to the filtrate. The formed precipitate was collected by filtration and subjected to recrystallization from acetonitrile and 5% (wt.) perchloric acid (HClO$_4$) solution. Yields 60-80%.

Scheme 2. Synthesis of 2a, a [1,2,3]triazolo[1,5-a]pyridinuim salt of formula I'.

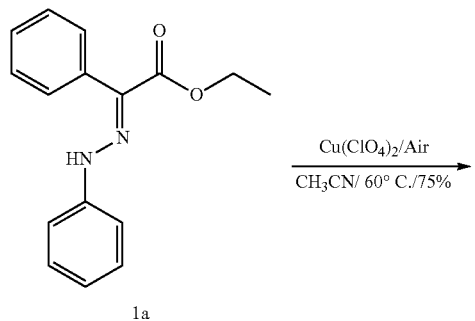

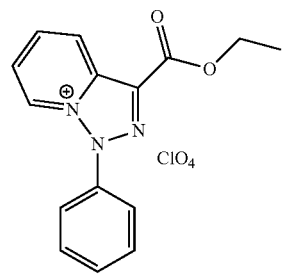

Procedure for 2a:

Compound 1a was synthesized according to a literature procedure.[1] Compound 1a was dissolved in 5 mL of acetonitrile (CH$_3$CN) and the well-stirred solution was heated to 60° C. Copper(II) perchlorate hexahydrate (Cu(ClO$_4$)$_2$·6H$_2$O) (0.741 g, 0.002 mol; 2 equiv.) was then added to the solution. The reaction mixture was kept at 60° C. overnight. The reaction mixture was then filtered, and 30 mL 5% (wt.) perchloric acid (HClO$_4$) solution was added to the filtrate. The precipitate was collected by filtration and subjected to recrystallization from acetonitrile and 5% (wt.) HClO$_4$ solution. The final product 2a was obtained as a light yellow powder (0.276 g, 75%); m.p.: decomposes >220° C.; $^1$H NMR (500 MHz, CD$_3$CN) δ 8.98 (dd, J=7.1, 0.5 Hz, H1), 8.81 (dd, J=8.8, 1.1 Hz, H4), 8.36 (dd, J=8.3, 7.7 Hz, H2), 8.02-7.94 (m, H3), 7.90 (tdd, J=10.4, 5.1, 2.9 Hz, H7), 7.87-7.80 (m, H5, H6), 4.61 (q, J=7.1 Hz, —CH$_2$—), 1.49 (t, J=7.1 Hz, CH$_3$) ppm; $^{13}$C NMR (75 MHz, CD$_3$CN) δ 159.06, 137.92, 136.69, 134.61, 134.31, 134.28, 133.48, 132.14, 127.96, 125.59, 125.22, 122.43, 110.60, 64.26, 14.33 ppm. MS (ESI): m/z found [M$^+$] for C$_{15}$H$_{14}$N$_3$O$_2{}^+$ 268.2 (calcd. 268.3).

Scheme 3. Synthesis of 2b, a [1,2,3]triazolo[1,5-a]pyridinuim salt of formula IIa'.

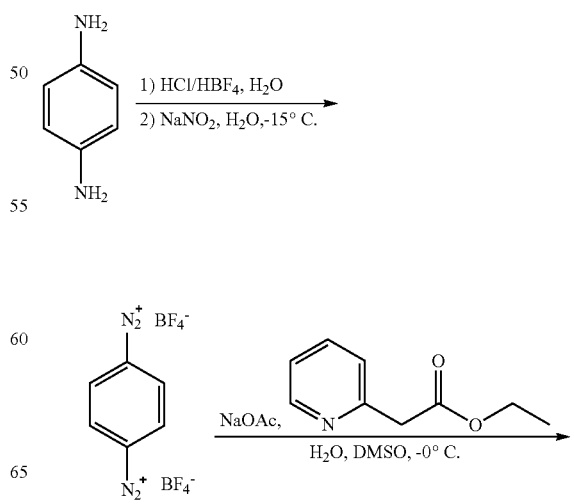

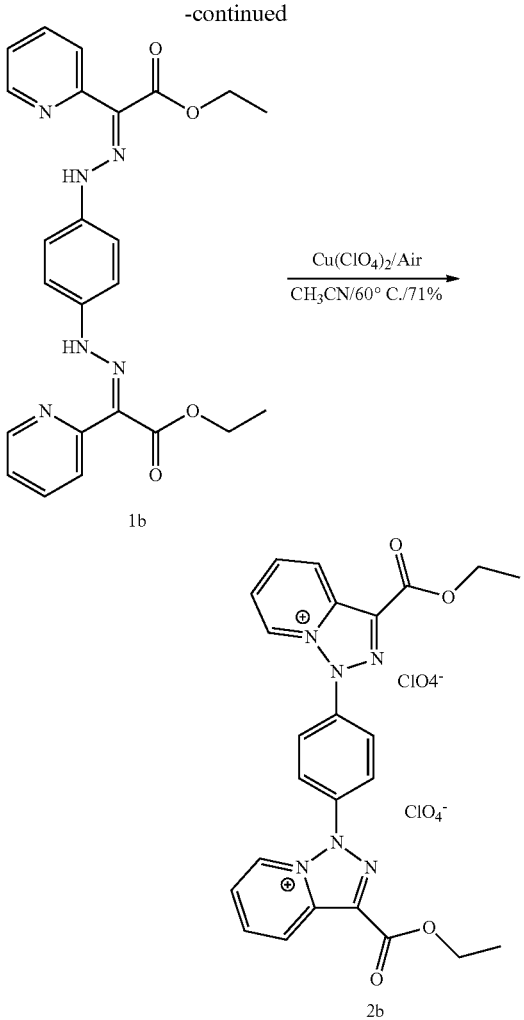

Procedure for 1b:

The diazotiation procedure of 1,4-phenylenediamine was modified from a previously reported method.[2] 1,4-phenylenediamine (0.54 g, 0.005 mol) was suspended in 2.5 concentrated hydrochloric acid (HCl) and was cooled to 15° C. using a dry ice/benzyl alcohol bath. A solution of 4 mL concentrated HCl and 4 mL 40% fluoroboric acid (HBF$_4$) was pre-cooled to 15° C. and added dropwise to the suspension. After 15 min, a cold solution (2 mL) of sodium nitrite (NaNO2, 1.38 g, 0.02 mol; 4 equiv.) was added dropwise to the suspension. After stirring for 1 h, the diazonium salt was collected by filtration. After washing with a small amount of water, the diazonium salt was added in small portions to a suspension of ethyl-2-pyridylacetate (1.5 mL, 0.01 mol; 2 equiv.) and sodium acetate (5.01 g, 0.032 mol; 6.4 equiv.) in an ice bath-cooled solution of 9 mL dimethyl sulfoxide (DMSO) and 15 mL water. The reaction mixture was stirred overnight, during which the product precipitated out. The precipitate was collected by filtration, re-dissolved in methylene chloride (CH$_2$Cl$_2$), washed twice with 30 mL saturated potassium bicarbonate (K$_2$CO$_3$) solution and dried over magnesium sulfate (MgSO$_4$). The crude product was then subjected to silica gel column chromatography (ethyl acetate/hexane 1:5) to give 1b as a dark yellow powder (2.20 g, 88%) m.p. 155.1-155.5° C.; $^1$H NMR (300 MHz, CDCl$_3$) δ 14.98 (s, N—H), 8.71-8.60 (m, H1), 8.28 (d, J=8.4 Hz, H4), 7.85-7.76 (m, H3), 7.39 (s, H5), 7.31-7.21 (2m, H2), 4.38 (q, J=7.1 Hz, —CH$_2$—), 1.45 (t, J=7.1 Hz, —CH$_3$) ppm; 13C NMR (75 MHz, CDCl$_3$) δ 165.92, 153.11, 146.39, 139.24, 136.85, 124.78, 124.32, 122.15, 116.13, 61.08, 14.58 ppm. MS (EI): m/z found [M$^+$] for C$_{24}$H$_{24}$N$_6$O$_4{}^+$ 460 (calcd. 460).

The $^1$H NMR spectrum of 2a, a salt of formula I', shows that all aromatic signals are shifted downfield relative to the parent hydrazone, which is consistent with the development of a positive charge in the pyridyl ring.[1] This effect is more pronounced in 2b, the salt of formula IIa', where the phenyl proton signal is shifted downfield to 8.33 ppm as opposed to 7.38 ppm in 1b. Moreover, the spectrum does not contain the hydrazone N—H proton, which is an indication that the oxidative cyclization has taken place.

Figure 9:
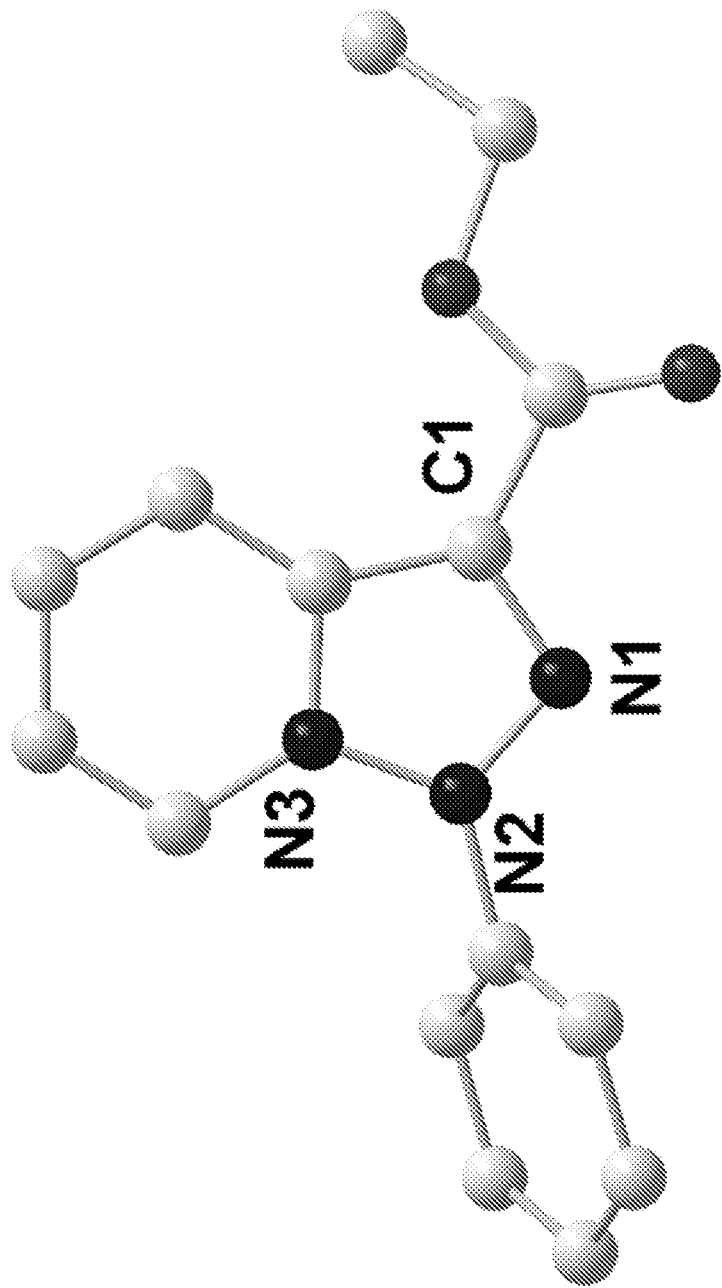
FIG. 9 shows the ball and stick drawing of the crystal structure of 2a, a salt of formula I'. The hydrogen atoms and the counterion were omitted for clarity.

The crystal structure of 2a, a salt of formula I' (FIG. 9) confirms the formation of the triazolopyridinium ring. The newly formed ring system is perfectly planar, and the distance between N2 and N3 is 1.364(2) Å, which is slightly longer than that in the neutral triazolopyridine (1.351(4) Å).[3] The C1-N1 bond length is 1.324(2) Å, which is longer than in hydrazone 1a (1.305(2) Å), but still within the C=N double bond range. The phenyl substituent at position 2 is not coplanar with the triazolopyridinium ring, and the dihedral angle between them is 63.40(5)°. This is in sharp contrast with the coplanar hydrazone 1a,[1] or 2-substituted [1,2,3]triazoles,[4] in which the aryl substituents are usually coplanar or have very small dihedral angles with the triazole cores. Since no significant intermolecular interactions were observed in the extended structure, the large dihedral angle can be attributed to the electronic structure in N2.

X-ray crystal data were collected using a Bruker CCD (charge coupled device) based diffractometer equipped with an Oxford Cryostream low-temperature apparatus operating at 173 K. Data were measured using w and f scans of 0.5° per frame for 30 s. The total number of images was based on results from the program COSMO[5] where redundancy was expected to be 4.0 and completeness of 100% out to 0.83 Å. Cell parameters were retrieved using APEX II software[6] and refined using SAINT on all observed reflections. Data reduction was performed using the SAINT software[7] which corrects for Lp. Scaling and absorption corrections were applied using SADABS[8] multi-scan technique, supplied by George Sheldrick. The structures are solved by the direct method using the SHELXS-97 program and refined by least squares method on F2, SHELXL-97, which are incorporated in SHELXTL-PC V 6.10.[9] All non-hydrogen atoms are refined anisotropically. All hydrogens were calculated by geometrical methods and refined as a riding model.

TABLE 1

Crystal Data and Parameters for 2a, a salt of formula I'.

| | |
|---|---|
| CCDC No. | 887676 |
| Empirical formula | C$_{15}$H$_{14}$ClN$_3$O$_6$ |
| Formula weight | 367.74 |
| Temperature | 173(2) K |
| Wavelength | 0.71073 Å |
| Crystal system | Monoclinic |
| Space group | P2$_1$/n |
| Unit cell dimensions | a = 13.7923(7) Å |
| | α = 90° |
| | b = 5.9508(3) Å |
| | β = 100.5400(10)° |
| | c = 19.9335(11) Å |
| | γ = 90° |
| Volume | 1608.44(15) Å3 |
| Z | 4 |
| Density (calcd.) | 1.519 Mg · m$^{-3}$ |
| Absorption coefficient | 0.277 mm$^{-1}$ |

TABLE 1-continued

Crystal Data and Parameters for 2a, a salt of formula I'.

| | |
|---|---|
| $F_{000}$ | 760 |
| Crystal size | 0.49 × 0.33 × 0.04 mm$^3$ |
| θ range for data collection | 1.66 to 25.39° |
| Index ranges | −16 ≤ h ≤ 16 |
| | −7 ≤ k ≤ 7 |
| | −24 ≤ l ≤ 24 |
| Reflections collected | 24909 |
| Independent reflections | 2947 [$R_{int}$ = 0.0287] |
| Completeness to θ = 25.36° | 100.0% |
| Absorption correction | Semi-empirical from equivalents |
| Max. and min transmission | 0.9896 and 0.8758 |
| Refinement method | Full-matrix least-squares on F$^2$ |
| Data/restraints/parameters | 2947/0/254 |
| Goodness-of-fit on F$^2$ | 1.047 |
| Final R indices [I > 2σ(I)] | $R_1$ = 0.0401, ω$R_2$ = 0.1110 |
| R indices (all data) | R1 = 0.0468, wR2 = 0.1178 |
| Largest diff. peak and hole | 0.422 and −0.332 e · Å$^{-3}$ |

Figure 10:
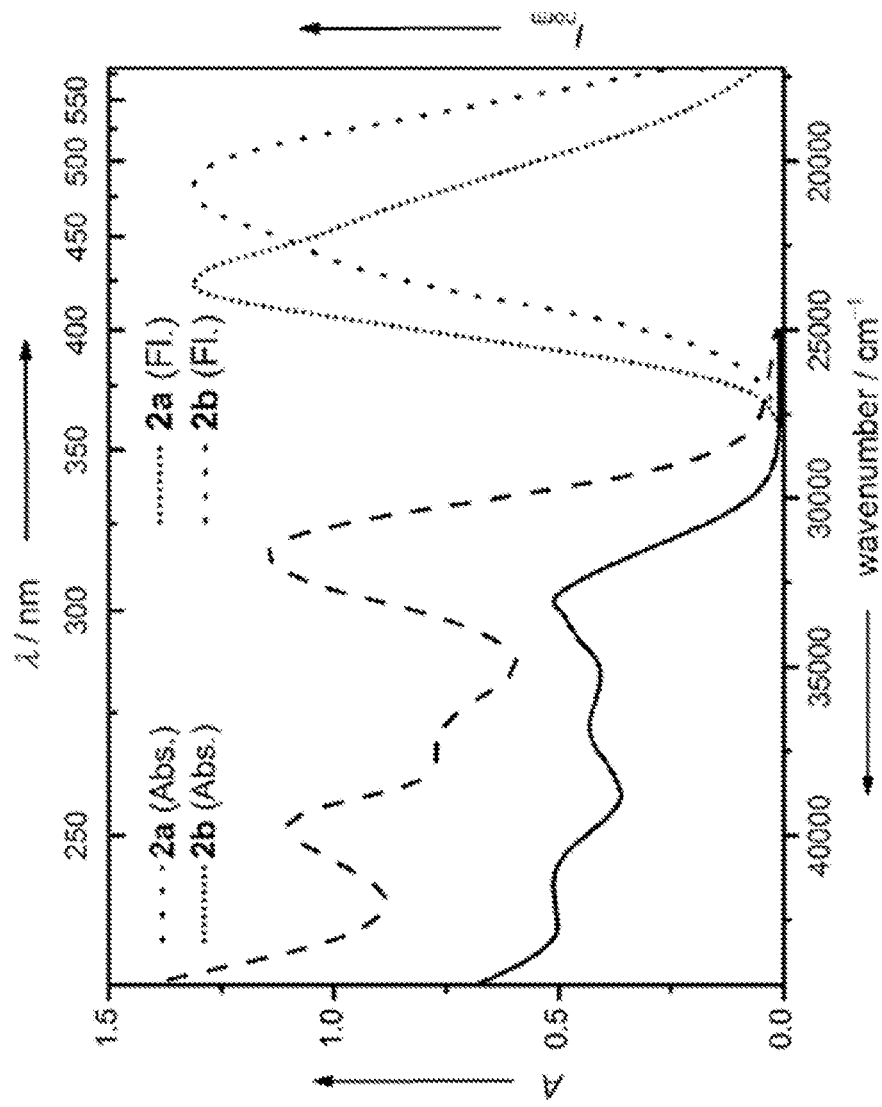
FIG. 10 shows the UV/Vis absorption (5.0×10$^{-5}$ M) and normalized emission spectra of 2a and 2b in H$_2$O.

Both 2a and 2b have good solubility in water and polar organic solvents, such as acetone, CH$_3$CN and EtOH. The UV/Vis spectra of 2a and 2b in H$_2$O (FIG. 10) show absorption maxima ($\lambda_{max}$) around 300 nm, and no appreciable solvatochromism is observed for both compounds. It is noteworthy that the extinction coefficient of 2b at $\lambda_{max}$ is nearly the double of that of 2a. Considering the fact that the triazolopyridinium ring is not in conjugation with the phenyl ring, the increase in extinction coefficient in 2b most probably results from the contribution of the additional triazolopyridinium unit. The H$_2$O solution of 2a emits green-blue light upon exicitation at 300 nm with a quantum yield of 0.05±0.02, whereas 2b emits deep blue light with a much higher quantum yield (0.30±0.02). The more than eight fold enhancement in quantum yield from 2b to 2a is much more significant than the increase in extinction coefficient. On one hand, 2b has one additional fluorophore than 2a. On the other hand, since the non-conjugated phenyl ring is able to quench fluorescence via electron transfer,[10] the introduction of a second electron-withdrawing triazolopyridinium unit in 2b can help reduce its quenching effect leading to the increase in quantum yield. For comparison, the photopysical properties of 2a and 2b were also studied in CH$_3$CN, and it was found that these properties are almost identical to those in H$_2$O.

TABLE 2

A summary of photophysical properties of 1 and 2 in CH$_3$CN solution$^a$

| | ABs. $\lambda_{max}$ (ε) | Fl. $\lambda_{em}$ (Φ$^b$) | Stokes shift | FWHM |
|---|---|---|---|---|
| 2a | 302 (11100) | 469 (0.05) | 167/11790 | 131/6008 |
| 2b | 311 (22100) | 412 (0.30) | 101/7882 | 94/5097 |

$^a$Abs. $\lambda_{max}$ and Fl. $\lambda_{em}$ are reported in nm, and the extinction coefficient ε is calculated in L · mol$^{-1}$ · cm$^{-1}$. Stokes shift and FWHM are reported in both nm and cm$^{-1}$;
$^b$±0.02.

The emission spectra of 2a and 2b reveal several interesting photophysical properties (Table 2). Both compounds have very broad emission profiles, spanning over the visible range, especially 2a that spans from 370 to over 600 nm. Furthermore, the full widths at half maximum (FWHM) for both compounds are as large as 100 nm. Both 2a and 2b exhibit mega Stokes shifts (above 100 nm), which is not a common phenomenon for simple organic dyes.[11] As mentioned before, this property is important for preventing self-quenching and light scattering. The CIE (Commission internationale de l'eclairage) 1931 color space chromaticity diagram was used to determine the color of the emissions, and the results show that from 2a to 2b, the color goes from green-blue (0.153, 0.187) to deep blue (0.154, 0.090), demonstrating the color tunability of the triazolopyridinium compounds.

Time-dependent density functional theory (TDDFT) calculations were performed on models of 2a and 2b to elucidate the quantum mechanical origins of the triazolopyridinium UV/Vis and fluorescence spectra. The computations utilized the PBE density functional,[12] a triple-zeta basis set,[13] and the COSMO continuum solvation model as implemented within ORCA 2.9.1.[14] Based upon the TDDFT results, the electronic transition responsible for the prominent UV/Vis transitions near 380 nm can be described as HOMO→LUMO transitions (The experimental and calculated excitation wavelengths are different because of limitations in the TDDFT formalism). Consistent with the experiment, TDDFT predicts that extinction coefficient for 2b is approximately triple that of 2a. Inspection of the MOs involved in this transition provides an explanation for the relative intensities of this band in 2a and 2b. In both cases, the HOMO is antibonding with respect to the triazolopyridiniumphenyl bond. For 2a, the LUMO is a triazolopyridinium-based mixture of triazolopyridinium and phenyl π-orbitals, whereas the LUMO is a phenyl-based mixture of the same two orbitals in 2b. Consequently, there is better orbital overlap of the HOMO and LUMO in 2b compared to 2a, resulting in a more intense UV/Vis transition.

The TDDFT calculations also clarify the origin of the broad bandshapes in the UV/Vis and fluorescence spectra of 2a and 2b. A TDDFT difference density difference plot shows that the UV/Vis transition has significant charge transfer character with electron density being donated by the phenyl substituent to the triazolopyridinium unit. In contrast, the altered LUMO in 2b means that the UV/Vis transition may be described as π→π. Consequently, significant differences are expected between the triazolopyridinium and phenyl π-bond strengths in the ground and excited electronic states, especially for the charge transfer transition of 2a.

Two [1,2,3]triazolo[1,5-a]pyridinium salts were synthesized from 2-pyridylphenylhydrazones via a novel Cu(II)-mediated oxidative ring closure reaction. The synthesized mono- (2a) and bis- (2b) triazolopyridiums are water soluble, show blue fluorescence, possess broad emission profiles and exhibit mega-Stokes shifts. Since the positive charge center of the triazolopyridinium ring can be susceptible to nucleophilic attack,[15,16] these compounds can be promising in terms of anion sensing.

REFERENCES

1. Landge, S. M.; Tkatchouk, E.; Benitez, D.; Lanfranchi, D. A.; Elhabiri, M.; Goddard, W. A., III; Aprahamian, I. Isomerization Mechanism in Hydrazone-Based Rotary Switches: Lateral Shift, Rotation, or Tautomerization? *J. Am. Chem. Soc.* 2011, 133, 9812-9823.
2. Zeng, X.-W.; Huang, N.; Xu, H.; Yang, W.-B.; Yang, L.-M.; Qu, H.; Zheng, Y.-T. Anti Human Immunodeficiency Virus Type 1 (HIV-1) Agents 4. Discovery of 5,5'-(p-Phenylenebisazo)-8-hydroxyquinoline Sulfonates as New HIV-1 Inhibitors in Vitro. *Chem. Pharm. Bull.* 2010, 58, 976-979.
3. Battaglia, L. P.; Carcelli, M.; Ferraro, F.; Mavilla, L.; Pelizzi, C.; Pellizi, G. *J. Chem. Soc., Dalton Trans.,* 1994, 2651-2654.
4. Yan, W.; Wang, Q.; Lin, Q.; Li, M.; Petersen, J. L.; Shi, X. *Chem.-Eur. J.,* 2011, 17, 5011-5018.
5. COSMO V1.58, Software for the CCD Detector Systems for Determining Data Collection Parameters. Bruker Analytical X-ray Systems: Madison, Wis., USA, 2008.
6. APEX2 V2008.5-0 Software for the CCD Detector System. Bruker Analytical X-ray Systems: Madison, Wis., USA, 2008.

7. SAINT V 7.34 Software for the Integration of CCD Detector System. Bruker Analytical X-ray Systems: Madison, Wis., USA, 2008.
8. Blessing, R. H. An empirical correction for absorption anisotropy. *Acta Cryst. A* 1995, 51, 33-38.
9. Sheldrick, G. M. A short history of SHELX. *Acta Cryst A* 2008, 64, 112-122.
10. Eriksen, J.; Foote, C. *J. Phys. Chem.* 1978, 82, 2659-2662.
11. Martin, A.; Long, C.; Forster, R. J.; Keyes, T. E. *Chem. Commun.*, 2012, 48, 5617-5619.
12. Perdew, J. P. Burke, K.; Ernzerhof, M. *Phys. Rev. Lett.*, 1996, 77, 3865-3868.
13. Schafer, A.; Horn, H.; Ahlrichs, R. *J. Chem. Phys.*, 1992, 97, 2571-2577.
14. Sinnecker, S.; Rajendran, A.; Klamt, A.; Diedenhofen, M.; Neese, F. *J. Phys. Chem. A*, 2006, 110, 2235-2245.
15. Kottschy, A.; Farago, J.; Csampai, A.; Smith, D. M. *Tetrahedron*, 2004, 60, 3421-3425.
16. Gelleri, A.; Messmer, A.; Nagy, S.; Radics, L. *Tetrahedron Lett.*, 1980, 21, 663-666.

The invention claimed is:

1. An organic light-emitting diode (OLED) comprising:
   an anode;
   a cathode; and
   a light emitting layer comprising at least one compound of the formula I:

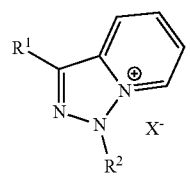

(I)

wherein
   $R^1$ is selected from the group consisting of H, $C_{1-6}$alkyl, $C(O)C_{1-6}$alkyl, CN, and $C(O)OC_{1-6}$alkyl;
   $R^2$ is selected from the group consisting of CN, $NO_2$, $C_{1-6}$alkyl and aryl, wherein the aryl is optionally independently substituted one or more times with halogen, $C_{1-6}$alkyl or $OC_{1-6}$alkyl; and
   $X^-$ is an anion or a dianion.

2. The OLED of claim 1, wherein the anion is a halide ion, a sulfate ion, a tetrafluoroborate ion, a perchlorate ion, a hexafluorophosphate ion, or a borate ion.

3. The OLED of claim 1, wherein $R^1$ is selected from the group consisting of $C(O)C_{1-6}$alkyl, CN, and $C(O)OC_{1-6}$alkyl.

4. The OLED of claim 1, wherein $R^2$ is phenyl and is optionally independently substituted one or more times with halogen, $C_{1-6}$alkyl or $OC_{1-6}$alkyl.

5. The OLED of claim 1, wherein the compound of formula I is one of the following compounds:

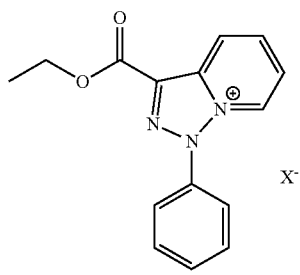

-continued

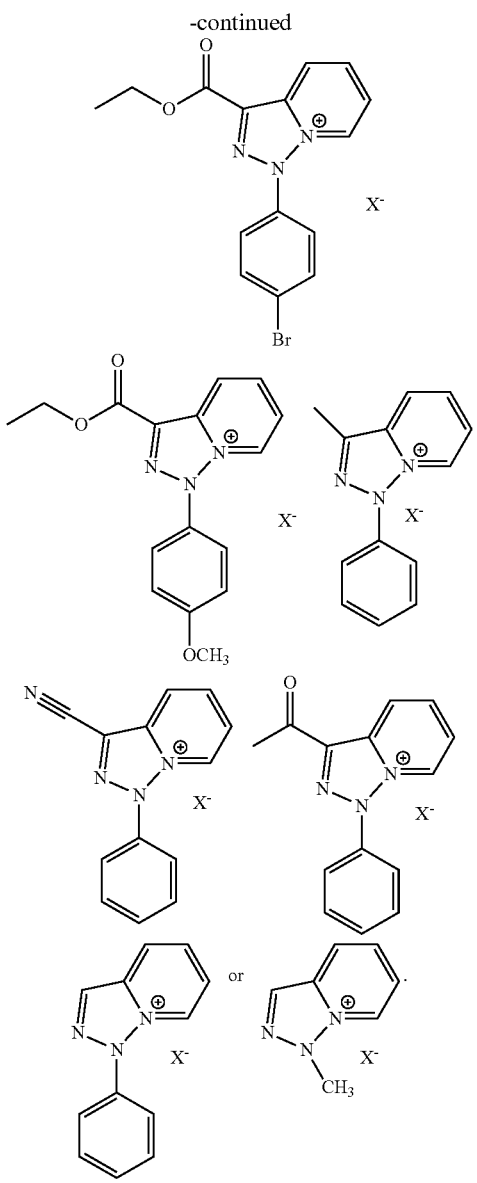

6. A compound of the formula I':

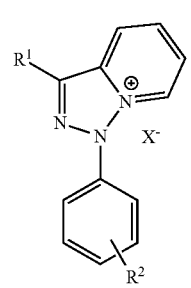

(I')

wherein
   $R^1$ is selected from the group consisting of $C(O)C_{1-6}$alkyl, CN, and $C(O)OC_{1-6}$alkyl;
   $R^2$ is selected from the group consisting of H, halogen, $C_{1-6}$alkyl and $OC_{1-6}$alkyl; and
   $X^-$ is an anion or a dianion.

7. The compound of claim 6, wherein the anion is a halide ion, a sulfate ion, a tetrafluoroborate ion, a perchlorate ion, a hexafluorophosphate ion, or a borate ion.

8. The compound of claim 6, wherein $R^2$ is selected from the group consisting of halogen, $C_{1-6}$alkyl, and $OC_{1-3}$alkyl.

9. The compound of claim 6, wherein R is in the para position.

10. The compound of claim 6, wherein the compound of formula I' is

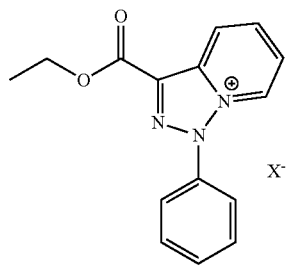

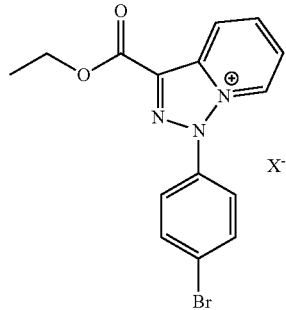

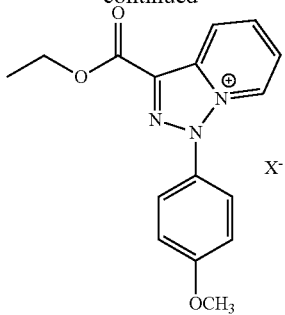

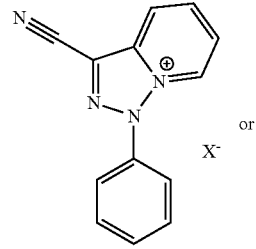

or

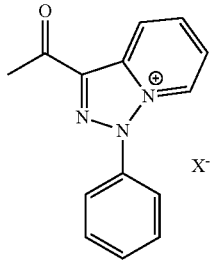

* * * * *